United States Patent
Teachman et al.

(10) Patent No.: US 10,540,790 B2
(45) Date of Patent: Jan. 21, 2020

(54) VISUAL CLASSIFICATION OF EVENTS

(71) Applicant: SCHNEIDER ELECTRIC USA, INC., Palatine, IL (US)

(72) Inventors: Michael Edward Teachman, Victoria (CA); John C. Van Gorp, Sidney (CA)

(73) Assignee: SCHNEIDER ELECTRIC USA, INC., Palatine, IL (US)

( * ) Notice: Subject to any disclaimer, the term of this patent is extended or adjusted under 35 U.S.C. 154(b) by 623 days.

(21) Appl. No.: 14/966,720

(22) Filed: Dec. 11, 2015

(65) Prior Publication Data

US 2017/0168656 A1 Jun. 15, 2017

(51) Int. Cl.
G06F 3/048 (2013.01)
G06T 11/20 (2006.01)
G01R 19/25 (2006.01)
G06F 3/01 (2006.01)

(52) U.S. Cl.
CPC ........ G06T 11/206 (2013.01); G01R 19/2506 (2013.01); G01R 19/2513 (2013.01)

(58) Field of Classification Search
CPC ............................ G06F 3/0481; G06F 3/04842
See application file for complete search history.

(56) References Cited

U.S. PATENT DOCUMENTS

| | | | |
|---|---|---|---|
| 5,894,311 A | 4/1999 | Jackson | |
| 8,775,934 B2* | 7/2014 | Nasle | G06F 17/5009 715/700 |
| 2013/0173322 A1 | 7/2013 | Gray | |
| 2014/0358293 A1* | 12/2014 | Fadell | G05D 23/1902 700/276 |
| 2015/0222495 A1* | 8/2015 | Mehta | G05B 23/0272 715/736 |
| 2016/0335787 A1* | 11/2016 | Martin | G06F 11/32 |

OTHER PUBLICATIONS

"Alarm Setpoint Learning Saves Time", Schneider Electric, Sep. 28, 2004, <http://www.powerlogic.com/newsroom.cfm?press=57>.

* cited by examiner

*Primary Examiner* — Nicholas Augustine
(74) *Attorney, Agent, or Firm* — Lando & Anastasi, LLP (57) ABSTRACT

A system comprises a central processing unit configured to receive, from at least one component monitor, a first set of readings for a component of a power system; provide the first set of readings to be displayed as a graph on a user interface; receive, from the user interface, a user selection of a portion of the first set of readings, and at least one user classification of the portion of the first set of readings; determine at least one characteristic of the portion of the first set of readings; detect the at least one characteristic in a second set of readings; and apply the user classification to the second set of readings.

20 Claims, 9 Drawing Sheets

VISUAL CLASSIFICATION OF EVENTS

BACKGROUND

1. Field of Invention

Aspects and embodiments of the present disclosure are directed to systems and methods for monitoring electrical systems and classifying data readings observed in such systems.

2. Discussion of Related Art

Existing monitoring systems can be configured to detect specific events occurring in an electrical system, such as voltage sags or spikes, undesirable harmonic content, outages, or other issues, and to preserve data recorded before, during, and after the event. Such systems may be configured to detect events that fall outside of user-defined setpoints. Yet such manually-defined setpoints are often cumbersome and inaccurate, in that measurements at different points in an electrical system may have different expected values during different application and operational cycles. For much the same reason, attempts to automatically adjust setpoints also have drawbacks, in that setpoints (whether automated or not) merely indicate when a reading exceeds the setpoint, and fail to take into account the context of a set of readings (i.e., a potential event or series of events) as a whole.

SUMMARY

According to one aspect of the present invention, a system is provided comprising a central processing unit configured to receive, from at least one component monitor, a first set of readings for a component of a power system, provide the first set of readings to be displayed as a graph on a user interface, receive, from the user interface, a user selection of a portion of the first set of readings, and at least one user classification of the portion of the first set of readings, determine at least one characteristic of the portion of the first set of readings, detect the at least one characteristic in a second set of readings, and apply the user classification to the second set of readings. According to one embodiment, the central processing unit is further configured to receive, from the user interface, a user selection of a notification profile, and generate, responsive to detecting the at least one characteristic in the second set of readings, a notification based on the notification profile. According to another embodiment, the central processing unit is further configured to receive, from a user input device, a selection of a geometric region of the graph of the first set of readings, and identify the portion of the first set of readings located within the geometric region.

According to one embodiment, the geometric region is a rectangle selectable by one of a computer mouse or trackball. According to one embodiment, the central processing unit is further configured to perform an action on the power system responsive to the application of the user classification to the second set of readings. According to one embodiment, the central processing unit is further configured to determine a trend in the portion of the first set of readings and to detect the trend in the second set of readings, wherein the trend in the second set of readings occurs over a different length of time than the portion of the first set of readings. According to one embodiment, the central processing unit is further configured to receive a user selection of at least one tag to be applied to the portion of the first set of readings. According to another embodiment, the at least one tag corresponds to an event affecting the component of the power system.

According to one embodiment, a method of detecting events in a power distribution system is provided comprising receiving, from at least one component monitor, a first set of readings for a component of a power system, displaying a graph of the first set of readings on a user interface, receiving, from the user interface, a user selection of a portion of the first set of readings, and at least one user classification of the portion of the first set of readings, determining at least one characteristic of the portion of the first set of readings, detecting the at least one characteristic in a second set of readings, and applying the user classification to the second set of readings. According to one embodiment, the method further comprises the act of receiving, from the user interface, a user selection of a notification profile, and responsive to detecting the at least one characteristic in the second set of readings, generating a notification based on the notification profile. According to another embodiment, the method further comprises the act of determining a confidence level for the application of the user classification to the second set of readings. According to yet another embodiment, the method of receiving, from the user interface, a user selection of a portion of the first set of readings comprises receiving, from a user input device, a selection of a geometric region of the graph of the first set of readings, and identifying the portion of the first set of readings located within the geometric region.

According to one embodiment, the geometric region is a rectangle selectable by one of a computer mouse or trackball. According to one embodiment, the method further comprises performing an action on the power system responsive to the application of the user classification to the second set of readings. According to one embodiment, the method of determining at least one characteristic of the portion of the first set of readings comprises determining a trend in the portion of the first set of readings, and wherein detecting the at least one characteristic in the second set of readings comprises detecting the trend in the second set of readings, wherein the trend in the second set of readings occurs over a different length of time than the portion of the first set of readings. According to one embodiment, the method of receiving, from the user interface, at least one user classification of the portion of the first set of readings further comprises receiving, from a user, a user selection of a first tag to be applied to the portion of the first set of readings. According to one embodiment, the method further comprises providing, in the user interface, the option to select the first tag to be applied to the portion of the first set of readings. According to another embodiment, the first tag corresponds to an event affecting the component of the power system.

According to another embodiment, the method of receiving, from the user interface, at least one user classification of the portion of the first set of readings further comprises receiving, from a second user, a second user selection of a second tag to be applied to the portion of the first set of readings. According to one embodiment, the method further comprises acts of determining that the first tag differs from the second tag, ascertaining which proposed tag of the first tag and the second tag has been selected by a greater number of users to be applied to the portion of the first set of readings, and applying the proposed tag to the portion of the first set of readings. According to another embodiment, the method of further comprises acts of determining that the first tag differs from the second tag, calculating tag statistics comprising a number of users that have applied the first tag to the portion of the first set of readings and a number of users that have applied the second tag to the portion of the first set of readings, and displaying the first tag, the second tag, and the tag statistics to a user of the user interface. According to yet another embodiment, the first tag indicates whether the portion of the first set of readings corresponds to a normal function of the component of the power system.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This disclosure is not limited in its application to the details of construction and the arrangement of components set forth in the following description or illustrated in the drawings. The disclosed systems and methods are capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

As discussed above, a fundamental drawback of current system using manual or automated setpoints is that they can be used to detect simply if a reading falls outside of an expected or normal range as defined by the user or system. Other aspects of the reading—such as the overall trend or "shape" of the readings, the length of time covered by the reading, the nature of the component being observed and the operations being performed on it at the time, and other contextual information are not taken into account. Various aspects and embodiments disclosed herein overcome that drawback by allowing a user to visually identify and classify an event. This allows the system to automatically identify characteristics of the event, so that a similar potential event can be identified in a second set of readings based on those characteristics.

Various aspects and embodiments disclosed herein include systems and methods for providing users the opportunity to visually classify events in an electrical system (e.g., an electrical distribution system). Aspects and embodiments disclosed herein include a central processing unit on a distributed system and a user interface for interacting with the central processing unit. Aspects and embodiments disclosed herein also include a monitor capable of observing and measurements about electrical or other aspects of an electrical system, to be stored and analyzed at a later time. A user (e.g., a system administrator, technician, or trainee) uses the user interface to graphically identify sets of readings corresponding to an event of a type that the user (or others) may wish to identify in future data, and to tag or label the event. The central processing unit determines a characteristic of the set of readings (i.e., event) identified by the user, such as the shape or trend of the readings observed during the event, and attempts to identify the same characteristic in a second set of readings and tag or label it appropriately with the tag.

Figure 1:
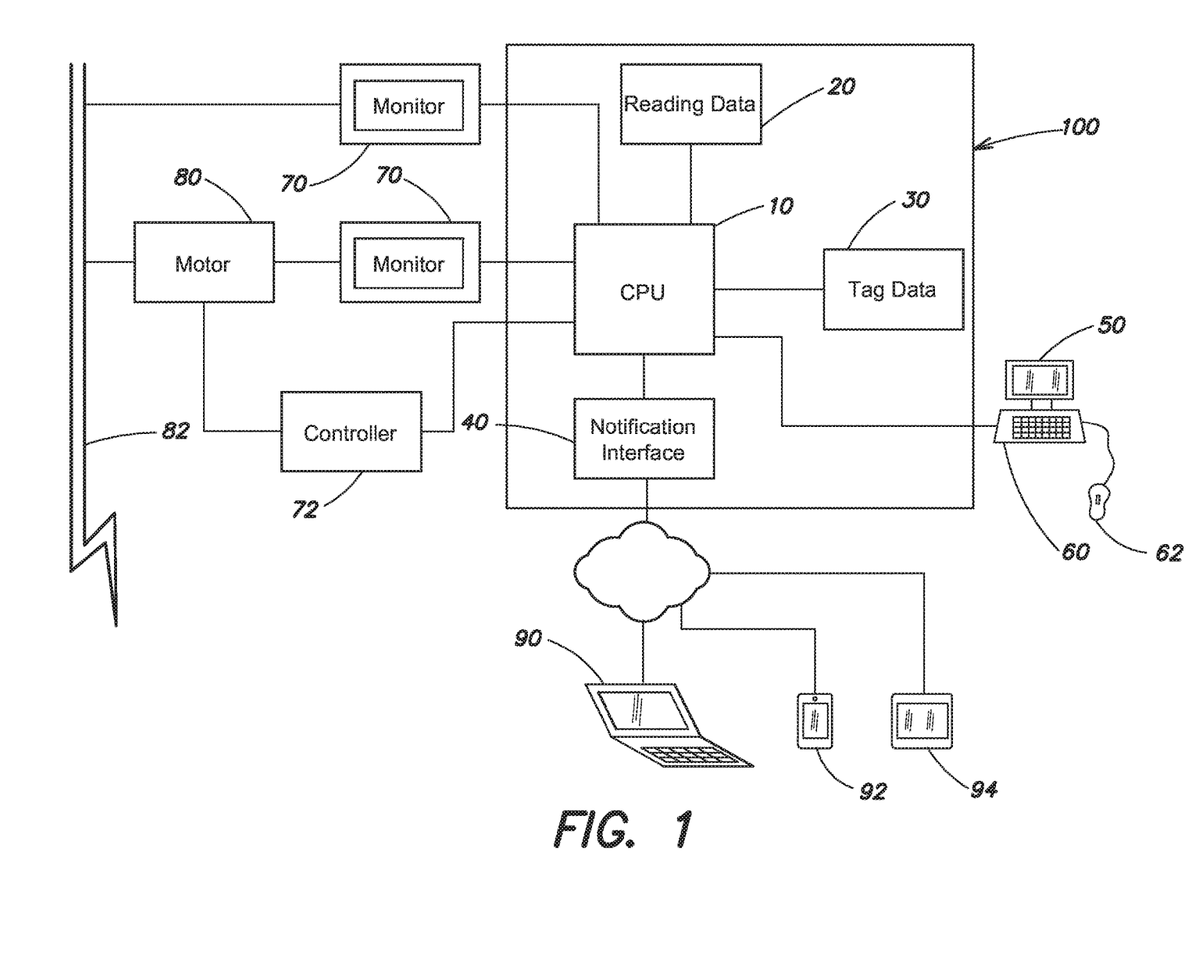
FIG. 1 is a schematic of an embodiment of a system for graphically displaying events in a power system.

An embodiment of a system for monitoring and tagging events in a power system is illustrated schematically, generally at 100, in FIG. 1. The system 100 includes at least one central processing unit (CPU) 10 for receiving performance characteristics of components of a power system. In the example of FIG. 1, monitors 70 measure some performance characteristics of motor 80 and/or transmission line 82. For example, the monitors 70 may measure voltage, current, resistance, power, load, impedance, or other electrical or performance characteristics of a power system or its components. Such components may include generators, transformers, power conditioners, inverters, buses, rectifiers, transmission lines, or other components not shown in FIG. 1. Readings taken by the monitors 70 may be stored in the system as reading data 20, which may be stored as a relational or non-relational database, text or flat file, delimited file, or other format for storing data as known in the art. Monitors may work in tandem to provide certain readings. For example, readings from a first monitor connected to a circuit inline before a component and a second monitor connected to the circuit inline after the component may be combined to determine a voltage drop across the component.

The system 100 provides at least one user interface 50, which may be displayed to a user via a user computer 60 having an input device 62 (e.g., a keyboard, mouse, trackball, touchscreen, or the like). The user interface 50 is configured to display the measurements in a graphical format, such as a time-series graph. For example, the measurements may be displayed in a voltage-over-time, current-over-time, resistance-over-time, or other format. The user interface 50 is further configured to receive a selection, by the user, of a portion of the measurements. The user interface may be configured to receive a graphical selection of a portion of the measurements. For example, the user may be provided the capability to draw a polygon (e.g., a rectangle) or free-hand selection around a portion of the measurements being displayed in the graph. The user interface 50 is also configured to receive a selection, by the user, of classifications (e.g., one or more tags or labels) to provide information about the portion of the measurements. For example, the user may be given the opportunity to type, click, or otherwise input the one or more tags into the user interface 50. In one example, the user may select a portion of voltage measurements occurring over a period of time and tag them with the "voltagespike" tag.

The one or more tags may be associated with the selected portion of the measurements and stored as tag data 30. The user interface 50 may provide additional functionality, such as searching for measurements from a particular time period to be displayed. The user interface 50 may also allow a user to "zoom" in and out in order to show measurements over a shorter or longer period of time, respectively.

The CPU 10 is further configured to determine one or more characteristics of the selected measurements, and to identify a second portion of measurements having at least one characteristic in common with the first portion of measurements. The system may then automatically apply the classification (e.g., tag) to the second portion of measurements. To continue the example above, the CPU 10 may examine the portion of voltage measurements tagged "voltagespike" and ascertain that the voltage measurements within the selected portion of measurements reflect an observed voltage range that, over a very short period of time, is higher than those in the surrounding portions. When a second portion of measurements is observed to have a voltage range that is similarly higher than those in the surrounding portions over a short period of time, that second portion of measurements can be automatically tagged "voltagespike" as well.

The system 100 further includes a controller 72 that is configured to control or perform an operation on some component or other aspect of the system. The controller 72 may act upon the system and/or component in response to a second portion of measurement being tagged. For example, the controller 72 may be coupled to a breaker and be configured to remove power from the component in the event of undesirable performance that may be a precursor to damage being done to the component and/or the system. As another example, the controller 72 may be coupled to a harmonic filter and be configured to control the harmonic filter in the event that undesirable harmonic content is detected.

The user interface 50 may allow a user to define a notification or other action to be taken in the event that another portion of measurements is tagged with the tag. For example, the user may be provided the option to receive a notification whenever the tag #voltagespike is automatically applied to a portion of measurements. A notification interface 40 may provide the notification that the tag has been applied to the second portion of measurements. For example, the notification may be sent by email, SMS, social media message, Twitter® Tweet, automated telephone call, row or record insertion in an event database, or other notification method. The user may receive the notification on one or more user devices 90, 92, 94.

Figure 2A:
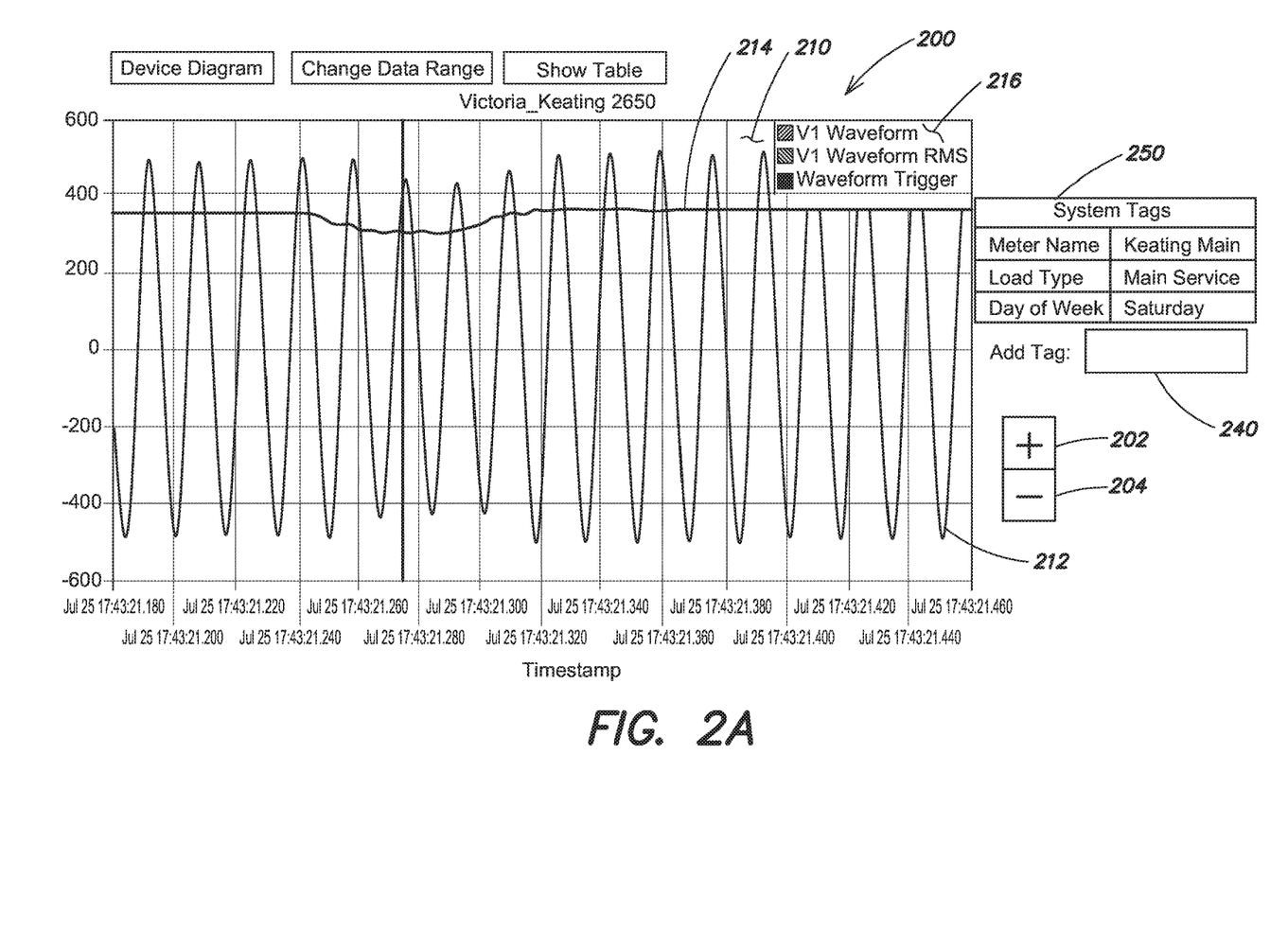
FIG. 2A is an example of a user interface.

An exemplary user interface 200 is shown in FIG. 2A. User interface 200 presents the user with a measurement window 210 graphically displaying measurements taken by one or monitors configured to monitor a power system. In FIG. 2, the measurement window 210 shows a time-series graph that depicts multiple series of voltage-related measurements over a particular timeframe. In particular, a voltage waveform series 212 and a voltage root-mean-square (RMS) waveform series 214 are shown, with time on the horizontal axis and voltage on the vertical axis. Of course, other measurements (e.g., current, resistance, or impedance) or functions thereof may be displayed in user interface 200 without departing from the spirit of the invention.

The user interface 200 include a series legend 216 for identifying which series are currently displayed and/or available to be displayed in measurement window 210. In some embodiments, series legend 216 may provide the user with the capability of adding, removing, or otherwise modifying the displayed series in the measurement window 210. For example, the user may be given the option to switch the type of series (e.g., from voltage to current) displayed in the measurement window 210. The user may further have the ability to add or overlay statistical functions of a series, such as the RMS waveform series 214 shown in FIG. 2, which depicts the root mean square of the voltage waveform series 214.

The user interface 200 further includes controls for adjusting the portion of the series visible in the measurement window 210. For example, controls 202 and 204 allow a user to zoom in on a particular time period or portion of a series, or to zoom out to encompass a longer time period or an additional portion of the series. In some embodiments, controls may be provided to allow zooming in and out along specific axes. For example, time (horizontal axis) zoom controls may allow the user to choose to see a longer or shorter time period. Measurement (vertical axis) zoom controls may allow the user to zoom in on a particular portion of a measurement, such as the upper peak of the waveforms.

The user interface 200 further includes a tag input region 240 allowing a user to enter a tag to be associated with a portion of a series. A text input box is shown, which may provide auto-complete functionality or other suggestions of existing or intuited tags. Other methods of applying a tag may be employed, such as clicking on a displayed tag to be associated with a portion of series, or dragging and dropping a displayed tag onto the portion of the series with which it is to be associated.

The user interface 200 further includes one or more tag legends 250 that display information about how the system or one or more users have tagged the displayed series or portions thereof. As discussed in more detail herein, a tag may be applied to some portions or all of a series. In some embodiments, tags may indicate how/where the measurements were taken. Tags may also indicate a load type (e.g., main or auxiliary service), and may indicate a day of week, part of week (e.g., weekday or weekend), time of day (e.g., 10:00 am), characterization of time of day (e.g., peak or non-peak), or other indications regarding the series and what it represents. For example, tag legend 250 reflects system-generated tags indicating that "Meter Name" is "Keating Main," that the Load Type is "Main Service," and that the Day of Week is "Saturday."

Figure 2B:
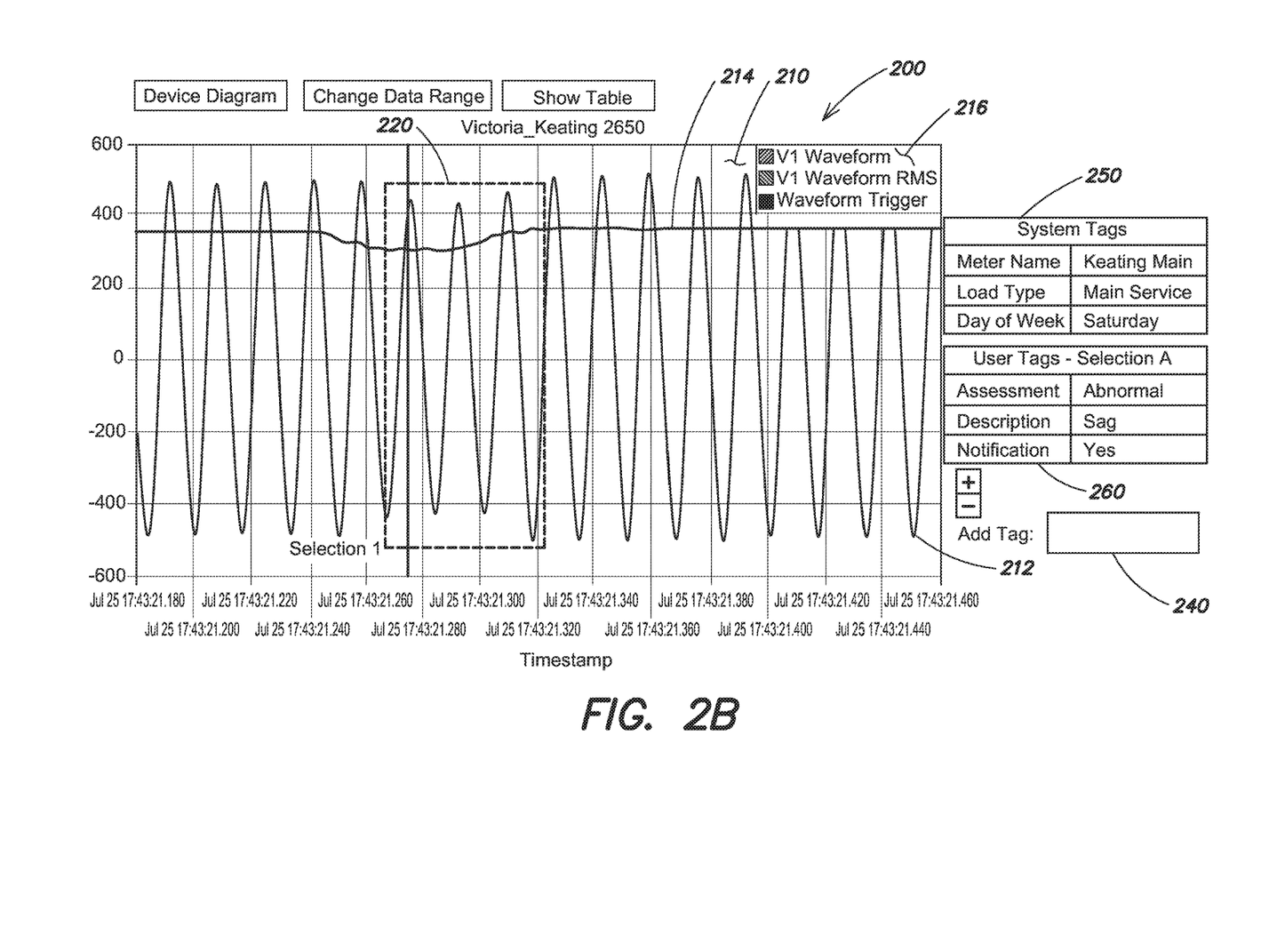
FIG. 2B is an example of a user interface.

FIG. 2B shows the user interface 200 in which a user selection 220 of a portion of the measurement window 210 has been made. The user selection 220 reflects that the user has characterized, or wishes to characterize, some aspect of those measurements displayed within the user selection 220. In this embodiment, the user selection 220 is made by the user drawing a rectangle within the measurement window 210 with an input device such as a mouse, trackball, trackpad, touch screen, or other such interface. Other methods of making the user selection 220 may be possible, including entering coordinates for a polygon representing the user selection 220. In some embodiments, the system may be configurable to automatically adjust user selection 220, for example, by "snapping" the edges of the polygon to a location that the system has determined may be desired by the user. For example, the right edge of the user selection 220 shown in FIG. 2B passes through the middle of an upward curving part of the series, which may have been an arbitrary or unintentional act by the user; the system may be configured to automatically adjust the user selection 220 to pass through a trough, peak, or other feature of the curve.

The user interface 200 in FIG. 2B displays an additional tag legend 260 corresponding to user-created tags that provide information about the measurements within user selection 220. As tag legend 260 shows, user selection 220 (referred to as "Selection A") has been tagged by a user with an Assessment of "Abnormal" and an associated Description is "Sag," meaning that the user has tagged user selection 220 as indicative of an abnormal voltage sag condition. Tag legend 260 further indicates that Notification is set to "Yes," indicating that the user and/or others should receive a notification in the event that the condition is identified in the future. The user interface 200 may also allow the user to activate or select user selection 220 by clicking on the associated tag legend 260, or vice versa.

Figure 3:
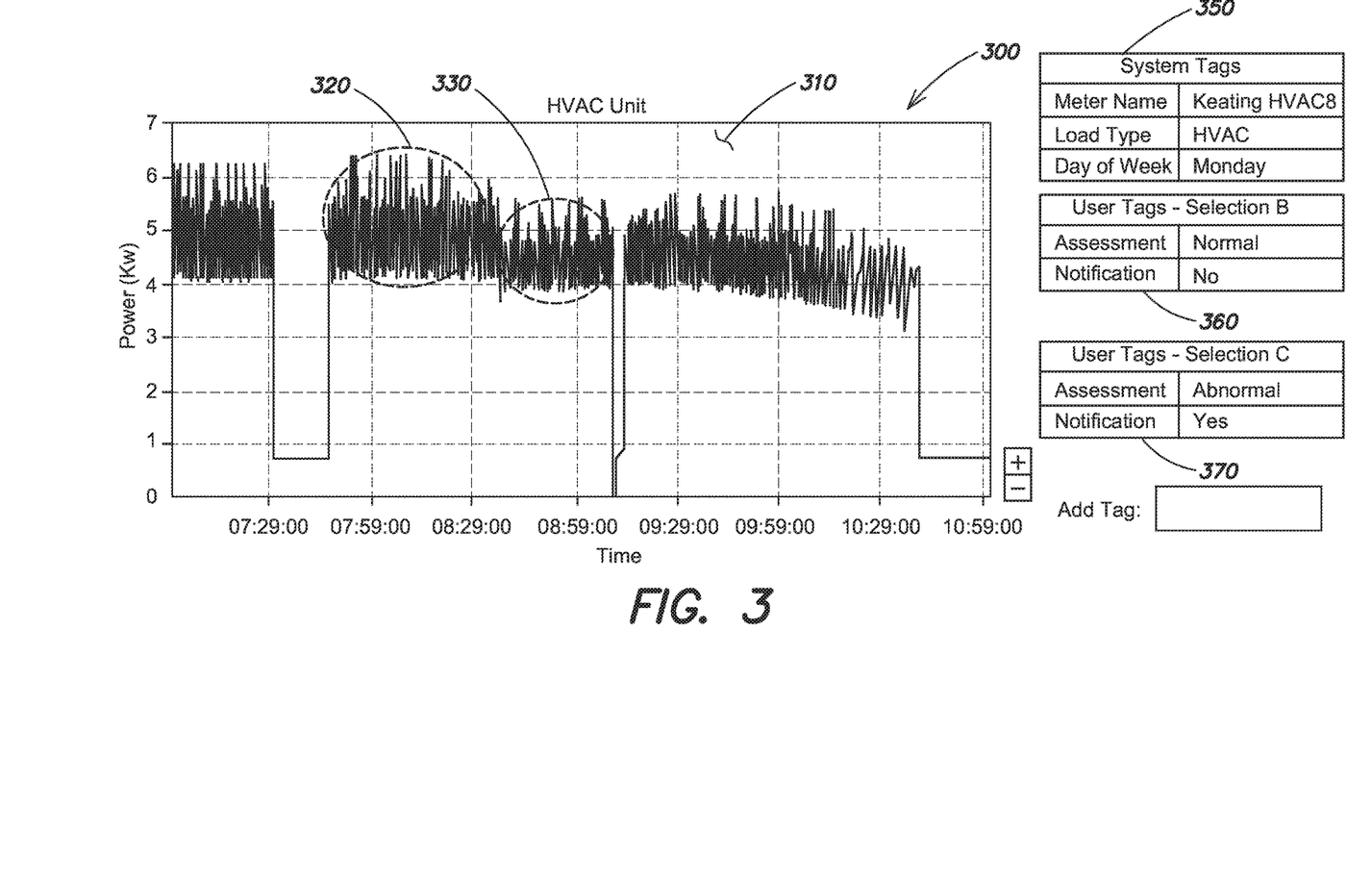
FIG. 3 is an example of a user interface.

It will be appreciated that the user selection 220 may be other than a rectangle, i.e., it may be a different polygon or other shape. The user interface 300 in FIG. 3 shows multiple oval user selections 320 and 330, corresponding to multiple different measurements from a series in the measurement window 310 that the user wishes to select. Tag legend 350 reflects system tags for the series of measurement data, indicating that "Meter Name" is "Keating HVAC8," that the Load Type is "HVAC," and that the Day of Week is "Monday." Tag legend 360 reflects user tags for the portion of measurements referred to as "Selection B," indicating that Assessment is "Normal" and Notification is "No." These tags may indicate to the system that the measurements reflect normal operation, and that notifications need not be sent when a similar set of measurements is observed in the future. Tag legend 370 reflects user tags for the portion of measurements referred to as "Selection C," indicating that Assessment is "Abnormal" and Notification is "Yes." This tag may indicate to the system that the measurements reflect abnormal operation, and that notifications should be sent when a similar set of measurements is observed in the future.

Figure 4:
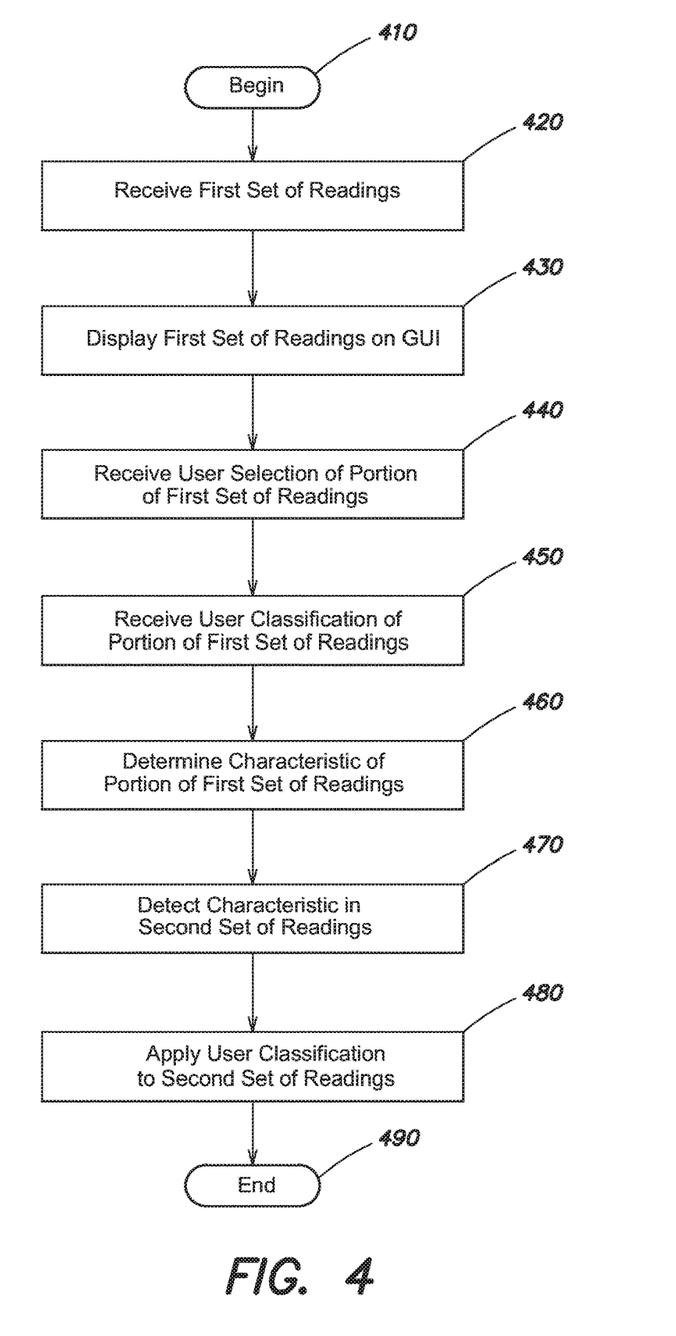
FIG. 4 is a flowchart of a method of applying tags to readings of events in a power system.

An embodiment of a method for visual tagging of events is illustrated generally at 400 in FIG. 4.

At step 410, the method begins.

At step 420, a first set of readings is received. The readings are received, directly or indirectly, from one or more monitors (e.g., monitors 70), and stored in a suitable memory or on-disk storage (e.g., reading data 20). Readings may include measurements taken regarding the voltage, current, resistance, power, load, impedance, or other electrical or performance characteristics associate with a power system or its components. Such components may include generators, transformers, power conditioners, inverters, buses, rectifiers, or transmission lines.

Readings are taken at intervals. In some embodiments, readings may be taken at regular intervals, such as every hundredth of a second, tenth of a second, second, or multiple thereof. In some embodiments, the system is configured to take more frequent readings in response to a previous or ongoing issue with the component, or at the user's instruction to do so.

In one embodiment, upon detection of an potentially interesting event, readings are stored at least until the end of the event is detected; otherwise, a relatively short historical record of readings may be preserved in order to minimize costs associated with storage and processing. In either case, historical readings no longer of use to the system may be retained, moved to external long-term storage, or may be deleted from the system.

Reading values themselves may be stored (e.g., as reading data 20) as the raw reading value received from the monitor, or may be modified or adjusted. Mathematical operations may be performed on readings from multiple monitors and the result stored. For example, readings from a first monitor connected to a circuit after a component may be subtracted from readings from a second monitor connected to the circuit before the component to determine a voltage drop across the component. Additional information is also stored with the reading values. For example, the datetime stamp associated with the reading (i.e., the time the reading was taken) may be stored. In some embodiments, more than one reading may be stored in a tabular format for a particular datetime. For example, the voltage, current, and internal resistance for a particular component may be stored at each interval. In other embodiments, different types of readings may be stored in different locations (e.g., separate tables).

In one embodiment, the system associates the first set of readings (or portions thereof) with one or more systems tags or other textual or graphical labels that classify some aspect of the first set of readings or their context. For example, system tags may be applied that identify the component, system, subsystem, datetime, load type, event type, or other characteristic known to the system regarding the first set of readings or the circumstances in which they were taken.

At step 430, the first set of readings is displayed on a graphical user interface, for example, user interface 50, or the user interfaces 200, 300 shown in FIGS. 2A, 2B, and 3. In a preferred embodiment, as discussed above with respect to FIGS. 2A, 2B, and 3, the user interface displays one or more series of measurements on a time-series graph, with the measurement (e.g., voltage) shown as a line varying along the vertical axis over a period of time (horizontal axis). In some embodiments, multiple series may be depicted, such as in different line types (e.g., broken, solid, or dashed) or in different colors. Controls may be provided to allow a user of the interface to toggle individual series so that they are visible or invisible. Series may further be selectably highlighted or otherwise activated so that a particular series of interest to the user can be emphasized. Selecting a series in such a way may cause the display or visual emphasis of a related vertical axis appropriate for displaying data in the series.

In a preferred embodiment, the first set of readings may represent an event automatically identified by the system as a candidate for tagging in later steps. For example, the system may determine that a particular set of the readings reflects a low average voltage over a period of time, and may present that set of readings to the user as the first set of readings.

As discussed above with respect to FIG. 2, controls may be provided to allow the user to zoom in or out of the data on one or more axes. For example, the user may be provided the option to show the series over a longer or shorter period of time, and may be provided the option to show a wider range of values along the vertical axis. In some embodiments, activating or hovering over a data point (e.g., with a mouse) on the displayed series may cause the underlying measurement to be displayed in proximity to the data point.

In another embodiment, the first set of readings may be displayed (or the option may be provided for the first set of readings to be displayed) in a table or other numerical format in which the measurements themselves are displayed.

In addition to displaying the first set of readings, the graphical user interface may also display user- or system-determined functions of the first set of readings, or other data derived from the first set of readings. For example, a graphical user interface displaying a voltage reading over time may also display the root-mean-square voltage. The graphical user interface may also be configured to display known calculated values when the values needed to perform the calculation are displayed and/or available. For example, if a series of measurements representing a current of a component is available, and a series of measurements representing a voltage of the component for the same time period is available, the graphical user interface may be configured to display the instantaneous electrical power (P) derived by the calculation $P(t)=I(t) \cdot V(t)$. Such derived calculations may be automatically displayed, or may be provided or suggested as an option to the user through the user interface.

At step 440, a user selection of a portion of the first set of readings is received. In a preferred embodiment, the user of the user interface is provided a user input device, such as a mouse, trackball, stylus, or other input device or component. The user then selects a portion of the first set of readings by clicking and dragging a polygon or other shape (e.g., circle or freehand line) around the portion of the first set of readings. In another embodiment, the user selects the portion of the first set of readings by clicking within the user interface at points above the x-axis corresponding to the start time and end time of the desired portion of the first set of readings. In still other embodiments, the user may be prompted to type in coordinates identifying which portion of the first set of readings is to be selected, or otherwise prompted to enter or select a start time and an end time.

In embodiments where the first set of readings is displayed in a table or other numerical format, the user selected of the portion of the first set of readings may be received by the user highlighting or otherwise selecting the data (e.g., the rows of the table) corresponding to the desired portion of the first set of readings.

At step 450, a classification of the portion of the first set of readings is received. In a preferred embodiment, the user associates the portion of the first set of readings with one or more tags or other textual or graphical labels that classify some aspect of the first set of readings, their context, or a desired action to be taken when a similar set of readings is encountered in the future. The user is provided the opportunity to type custom tags, or may be provided with a list of existing tags from which to choose. In one embodiment, the system may suggest appropriate tags based on rules, criteria, previously-tagged readings, or other information.

In a preferred embodiment, a tag is associated with an attribute, with the tag providing a value or other input for the attribute. For example, the system may provide for the user to enter a source tag, which identifies the component, system, or subsystem to which the readings relate. The user may also provide a load tag identifying the type of load associated with the reading data. The user may also provide a time period tag identifying a day of week, day of month, week of month, day or month of year, or other distinguishing information about the time in which the reading was taken, such as whether it was a weekend or a peak usage period. The user may also provide a context tag, which may include information relevant to interpreting the reading data and identifying similar future readings. For example, the user may provide a context tag of "heatwave" to indicate that the current weather conditions are such that users are likely using air conditioning (and therefore drawing power from the system) at a higher rate than usual. The user may also provide an event tag, which may include information explaining or characterizing a system operation, function, or condition occurring during the time the readings were taken. For example, an event tag of "startup" may indicate that a motor component is in the transient state of starting up, which may explain variations from expected normal operation. The user may also provide a diagnosis tag, which may include information diagnosing an underlying reason for deviations in the reading data from their expected values. For example, a diagnosis tag of "voltage-sag" may indicate that the reading data reflects a period during which voltage sag was experienced. As another example, a diagnosis tag of "harmonic-content" may indicate that the reading data reflects a period during which harmonic content is experienced in the system. Harmonic content is an undesirable phenomenon in multi-phase systems, and can negatively affect power quality of the system. The user may also provide an assessment tag, which may indicate a conclusion relating to the diagnosis or other characterization of the reading data. For example, an assessment tag of "abnormal" may be provided. The user may also provide a notification tag, which may indicate whether notifications should be sent to draw attention to a recent, ongoing, or recurring issue identified in the reading data. The user may also provide an action tag, which may include instructions that the system should initiate automatically in response to a detected system operation, function, or condition of the power system or a component thereof. In some embodiments, the system may automatically take or suggest certain actions in response to a second set of readings being tagged, regardless of whether an action tag has been specified. For example, where the second set of readings indicates that system failure, or damage to the system, is imminent, a breaker may be tripped to disable the affected component or reroute current around the component to avoid an outage.

Additional tagging features and functionality may be provided, such as tags having predefined values or meanings that are recognized by the system. For example, a characterization tag may be expected or requested from the user with the assigned value having a meaning to the system. Assigning the characterization tag a value of "too-low" may be recognized by the system as providing an upper boundary by which lower readings can in the future be automatically tagged as "too-low" as well. Similarly, assigning a characterization tag of "average" may be compared with other "average" characterization tags to determine a band of readings that may be considered and tagged as "average."

The user may be allowed to create, with some limitations, user-specific tags as desired, and tags may have no inherent meaning beyond the association created between a tag and a portion of the first set of readings. Rules may be enforced to distinguish between system- and user-created tags, and tags may be displayed differently depending on whether they were created by the system or user. For example, system-created tags may be all lowercase, whereas user-created tags may be required to start with an upper-case letter. System- and user-created tags may be displayed in different colors, font sizes, or otherwise visually differentiated, as well.

At step 460, one or more characteristics of the portion of the first set of readings are determined, for example, by CPU 10. In one embodiment, it is determined that the portion of the first set of readings differs from neighboring portions of the first set of readings in some way. For example, the portion of the first set of readings may result in an average reading (e.g., average voltage) that exceeds a threshold average voltage by some threshold. The threshold average voltage may be determined by user input, reference to other readings from the first set of readings, reference to other readings from comparable time periods, or reference to other information. As another example, the first set of readings may be determined to include readings that exceed a threshold. In one embodiment, a regression model may be determined from the first set of readings, and the resulting model or function stored. A set of data points occurring at standardized intervals may be generated from the resulting model, so that comparison can later be made with other readings similarly standardized from readings taken at a different frequency.

In one embodiment, a characteristic of the portion of the first set of readings may be determined with reference to other subsystem or components whose operation may have an effect on the subsystem or component to which the first set of readings relate. For example, the system may review logs or schedules to determine what conditions or events may have preceded an event tagged in the portion of the first set of readings. For example, the system may detect that, according to a schedule or other instruction to do so, a number of motors in the system started simultaneously immediately before a voltage sag occurred. This coordinated startup may be identified by the system as a characteristic of the portion of the first set of readings in which the voltage sag is reflected.

In one embodiment, a characteristic of the portion of the first set of readings may be determined independently of the time period represented in the portion of the first set of readings. That is, a shape, profile, or other aspect of the portion of the first set of readings may be identified so that it can later be compared with another set of readings that, while occurring over a different length period of time, may nonetheless share the characteristic.

The one or more characteristics of the portion of the first set of readings are stored for later comparison with other sets of readings. The entire portion of the first set of readings may be stored, or a regression model or fitted data points generated therefrom may be stored. In one example, the maximum, minimum, mean, or standard deviation of reading(s) in the portion of the first set of readings may be stored. In another example, the deviation of the readings from an expected, average, or determined threshold reading may be stored.

At step 470, the one or more characteristics are detected in a second set of readings. The one or more characteristics are detected by evaluating how the second set of readings relates to the readings, criteria, threshold, or model determined with respect to one or more readings previously tagged by the system or users. For example, if the maximum, minimum, mean, or standard deviation of reading(s) in the portion of the first set of readings is stored, the maximum, minimum, mean, or standard deviation of readings in the second set of readings may be compared to those of the portion of the first set of readings in order to determine if a sufficient correlation exists. As another example, and discussed above, a regression model may be determined from the second set of readings, and the resulting model or function, may be compared to the portion of the first set of readings. A set of data points occurring at standardized intervals may be generated from the resulting model, so that comparison can be made with the characteristics of the portion of the first set of readings, to determine if a correlation exists.

A comparison to a portion of a first set of readings having a defined tag may also be performed. For example, a determination that a second set of readings is higher than a portion of a first set of readings tagged "too-high" may cause the second set of readings to be tagged "too-high" as well.

It will be appreciated that while the examples given here refer to a comparison with a portion of the first set of readings for simplicity of illustration, it is possible and desirable to compare the second set of readings to any number of available previously-tagged readings in order to best tag the second set of readings. A larger set of previously-tagged readings allows for greater refinement of the thresholds and criteria according to which classifications are applied to later readings. For example, the system may use a set of readings previously tagged as "too-low" to determine the upper threshold of what constitutes a reading that should be tagged as "too-low" in the future.

In one embodiment, the one or more characteristics are detected in a second set of readings by comparison to the portion of the first set of readings without regard to the time period covered by either set of readings. Where a second set of readings may have a characteristic of the portion of the first set of readings, a commonality may be determined even where, for example, the portion of the first set of readings spans less than 5 minutes, and the second set of readings covers a time period of 2 hours. The minimum, maximum, mean, overall trend, shape, progression, or outcome of the two sets of readings may be compared to determine if there is a correlation. Such a correlation may be found through dynamic time warping (DTW) algorithms, shape matching, or other techniques known in the art.

At step 480, the classification is applied to the second set of readings. System- and/or user-created tags associated with the portion of the first set of readings are associated with (i.e., applied to) the second set of readings. For example, if a portion of the first set of readings was tagged with the "voltage-sag" tag at step 450, and the second set of readings is determined at step 470 to share a characteristic of the portion of the first set of readings such that there is sufficient correlation between the two, then the second set of readings is also tagged with the "voltage-sag" tag.

Tags may be associated with the second set of readings based on other tags applied to the second set of readings. To continue the previous example, if the portion of the first set of readings has been tagged "voltage-sag," and the portion of the first set of readings has also been tagged "abnormal," then the second set of readings may be tagged "abnormal" as well. In another example, if a portion of the first set of readings from a motor component has been tagged "power-spike" and "startup" (indicating that the portion of the first set of readings corresponds to an expected power spike experienced during startup of a motor), and has also been tagged "normal," then the application of the "power-spike" and "startup" tags to the second set of readings may cause the "normal" tag to be applied to the second set of readings as well.

In general, additional tags may be applied to a set of readings by applying logic to a set of previous tags already applied to the set of readings, with a high degree of logical complexity provided for. In another example, if a portion of a first set of power readings from a motor component has been tagged "too-high" and "abnormal," and a second set of readings from the same component has some of the same characteristics, the presence of a "startup" tag applied to the second set of readings (indicating that the motor is in a startup phase) may cause the system to recognize that a power spike at startup is normal, and tag the second set of readings as "normal."

After the tags have been applied to the second set of readings, the second set of readings and the associated tags may be displayed via a user interface (e.g., user interface 50). The tags may be visually displayed to convey additional information. For example, a confidence level may be determined reflective of the system's confidence in applying a particular tag to the second set of readings, and the tag may be displayed at a brightness varying according to the confidence level.

At step 490, method 400 ends.

The functionality described herein can be employed on systems having multiple users. For example, the system may characterize a second set of readings by comparing them to multiple previous readings tagged by different users. In some situations involving multiple users, it may be expected that tags may conflict or otherwise be incompatible. For example, one user may tag a set of readings as "abnormal" and "too-high," whereas another user may tag the same set of readings as "normal" and "average." The system may later identify a characteristic of those earlier sets of readings in a second set of readings, and, in attempting to apply the tags associated with those earlier readings, may determine that the tags are in conflict. To continue the example, the system may determine that "normal" and "abnormal" tags are in conflict.

Conflict resolution among tags may be performed in any number of ways. In one example, the system may preserve and identify each individual's tags, such as by tagging the second set of readings both "@johndoe-normal" and "@bobsmith-abnormal." In another example, the system may resolve the conflict by applying a tag provided by a majority of users.

Figure 5:
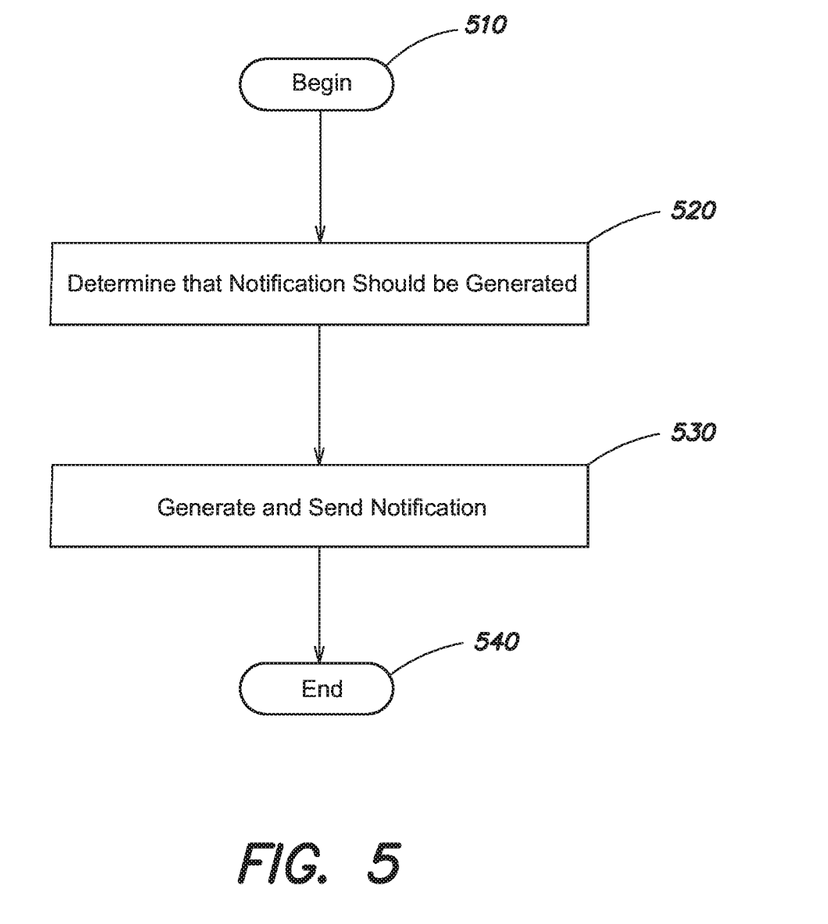
FIG. 5 is a flowchart of a method of sending notifications in response to events in a power system being tagged.

An embodiment of a method for sending notifications in response to events is illustrated generally at 500 in FIG. 5.

At step 510, the method begins.

At step 520, a determination is made that a notification should be generated in response to a classification being applied to a set of readings (e.g., as in step 480 of method 400). The determination is made in response to one or more tags meeting a notification criteria for one or more users. The determination may be made in response to a predetermined notification tag being applied to the set of readings. For example, the association of the tag "notify" with the set of readings may determine that a notification should be generated. The determination may be made in response to defined tags being assigned, such as an Assessment tag of "abnormal" being assigned to the set of readings.

Notifications are configurable by their intended recipients or other users, including system administrators. For example, a user may indicate a desire to receive a notification whenever the tags "notification" or "abnormal" are applied to a set of readings. Logical operators may be employed. For example, a user responsible for a subsystem called Subsystem 1 may wish to only receive notifications when the Assessment tag "abnormal" and the Meter Name tag "SubSys1" are applied to the set of readings. System administrators may configure default or override notification settings, to ensure that certain users receive certain notifications regardless of their personal configuration for notifications. In another embodiment, notification settings may be configured through the tags themselves. For example, a user may have defined, as part of method 400, that a particular event should be tagged as "@johnsmith-notify." The presence of that tag could cause the system, as part of the current process, to determine that a notification should be generated. Additional parameters regarding the notification may also be indicated in the tag, e.g., "@johnsmith-notify-pager."

At step 530, a notification is generated and sent. User notification and preference information may be stored in a database accessible by the system, so that the notification may be delivered. For example, when one or more individuals should receive a notification, the contact preferences of the individual may be accessed and used to contact the individual. Preferences may include the method of contact (e.g., email, voicemail, SMS/MMS message, pager), the times of day during which notifications should or should not be sent, and the contact information (e.g., email address, phone number, etc.) The content of the notification may be configurable, and may comprise a short message indicating a status of a component, the fact that one or more tags were applied to the set of readings, or other information. The notification may contain a URL or short URL directing a browser to a location that provides additional information. The notification may also contain an image, or a link to an image, depicting the set of readings graphically in much the same way as seen in FIGS. 2A, 2B, and 3.

Method 500 ends at step 540.

In some embodiments, the system is also configured to automatically perform certain tasks in response to a tag being applied to the second set of readings. For example, a portion of a first set of readings may have previously been tagged by a user as indicative of harmonic content, and may also have been tagged with an action tag indicating that the system should apply a harmonic filter to the affected current. Thus, when a second set of readings is detected as having harmonic content, the system may automatically apply a harmonic filter to the system in order to remediate the issue. To continue an earlier example, where a second set of readings is tagged as indicating a voltage sag, the simultaneous or imminent startup of any motors or other components may be postponed and/or staggered to mitigate the voltage sag.

In some embodiments, the action associated with the action tag is performed automatically without delay. In other embodiments, a system operator or other user is prompted to perform the action, or the system may issue a notification that the action will be performed after some certain amount of time unless an instruction to the contrary is received.

Figure 6:
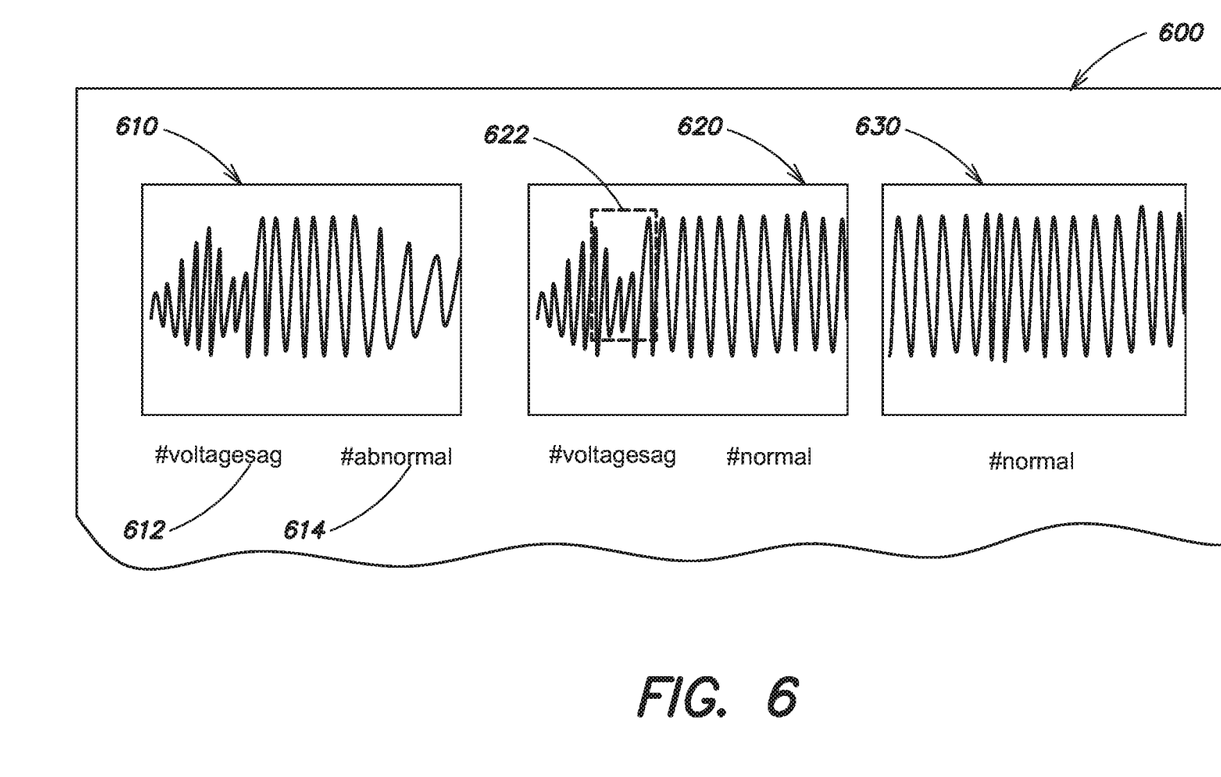
FIG. 6 is an example of a user interface.

Additional viewing capabilities of the readings recently or previously tagged may be provided. In one embodiment, a user interface is provided to visually present a user with multiple thumbnail or reduced-size images of previously-tagged data, along with the tags applied to the data. The user may interact with the system to view previously-tagged data, or add/remove/modify tags associated with the data. An example of such a user interface 600 is shown in FIG. 6. Interface icons 610, 620, 630 each depict tagged portions of data, with the relevant tags displayed in proximity to the respective interface icon. For example, the tag 612 "#voltagesag" and the tag 614 "#abnormal" are displayed beneath the respective interface icon 610. Clicking on the interface icons 610, 620, 630 may cause the portion of the series displayed in the interface to be displayed in a larger, interactive display (e.g., user interface 600). The selection associated with the tag may also be displayed. For example, selection 622 previews the portion of the user interface 620 that has been tagged "#voltagesag" and "#normal."

Clicking on a tag 612, 614 may cause the plurality of interface icons to be filtered so that only interface icons displaying data associated with measurements tagged with that tag are displayed. For example, clicking on the tag 612 "#voltagesag" may cause interface icon 630 (tagged only as "normal") to not be displayed in the interface 600, because the interface icon 630 is not tagged "#voltagesag." Interface icons 610, 620, and any other interface icons associated with measurements tagged "#voltagesag" would continue to be displayed. Clicking on a tag a second time may toggle the filter off, such that all interface icons are displayed again. Multiple tags may be combined to create a complex multi-factor filter. Logical operators, such as "NOT," "AND," or "OR" may also be employed in a filter. For example, the user may wish to display in interface 600 only those interface icons representing data that has been tagged "#voltagesag NOT #abnormal."

Returning to FIG. 1, one or more components of the system, including the CPU 10, notification interface 40, and user interface 50, may include a computerized control system. Various aspects may be implemented as specialized software executing in a general-purpose or specialized computer system 700 such as that shown in FIG. 7. The computer system 700 may include a processor 702 connected to one or more memory devices 704, such as a disk drive, solid state memory, or other device for storing data.

Figure 7:
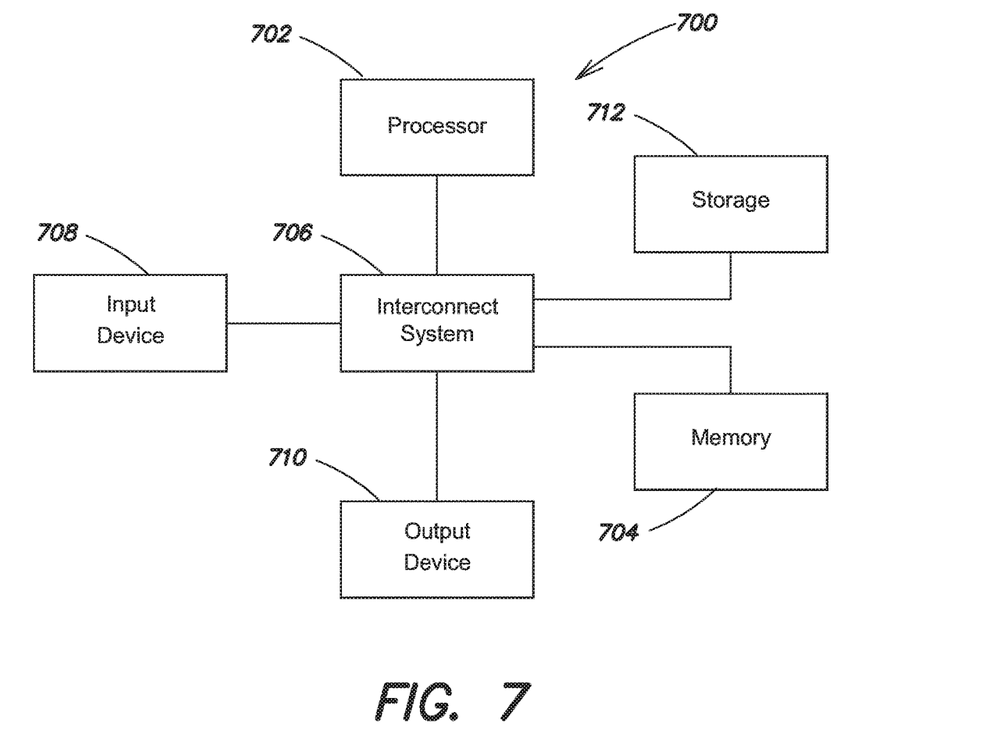
FIG. 7 is a schematic of a computer system including in embodiments of a system for graphically displaying events in a power system.

Memory 704 is typically used for storing programs and data during operation of the computer system 700.

Components of computer system 700 may be coupled by an interconnection mechanism 706, which may include one or more busses (e.g., between components that are integrated within a same machine) and/or a network (e.g., between components that reside on separate discrete machines and/or between monitors 70, notification interface 40, user interface 50, and/or CPU 10). The interconnection mechanism 706 enables communications (e.g., data, instructions) to be exchanged between system components of system 700. Computer system 700 includes one or more input devices 708, for example, a keyboard, mouse, trackball, microphone, or touch screen through which an operator may issue commands or programming to the system 700. Computer system 700 includes one or more output devices 710, for example, a printing device, display screen, and/or speaker. In addition, computer system 700 may contain one or more interfaces (not shown) that connect computer system 700 to a communication network in addition or as an alternative to the interconnection mechanism 706. These interfaces may be utilized by the central processing unit to collect data from monitors and/or to communicate with the monitors. These interfaces may include a communication pathway for notifications to be sent.

Figure 8:
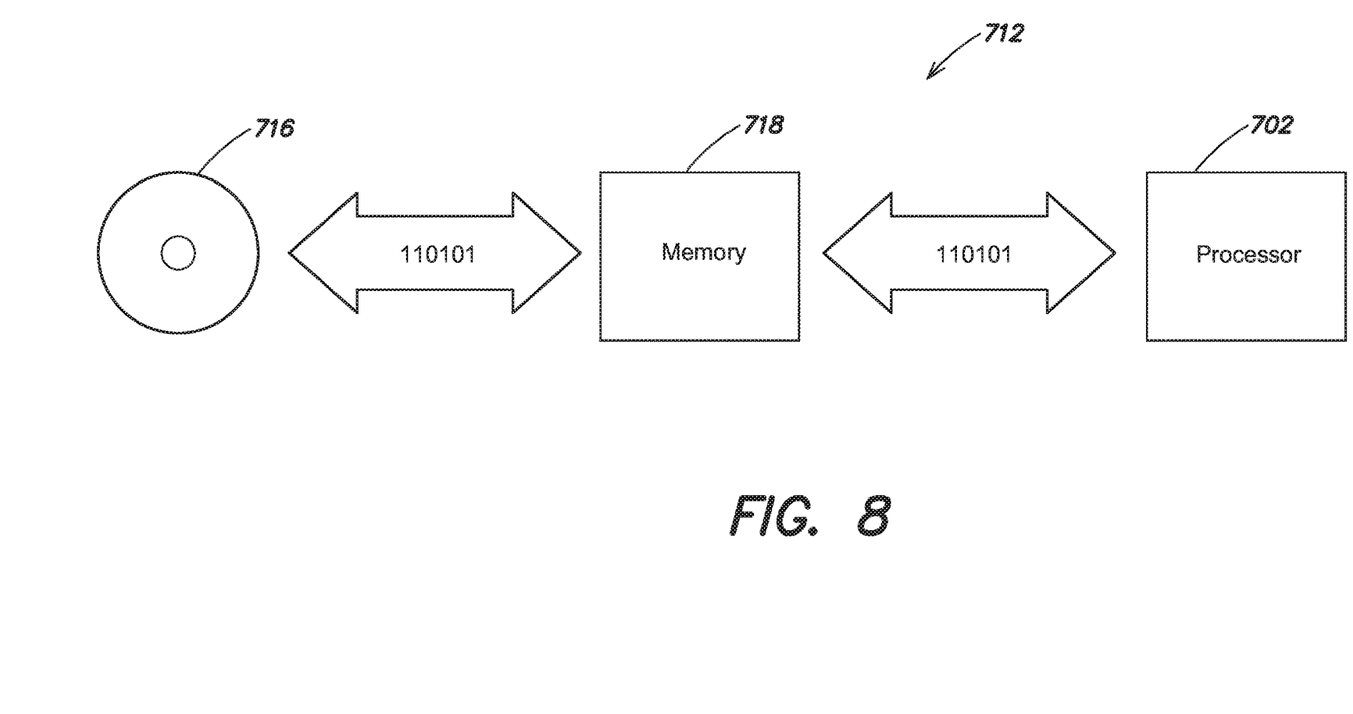
FIG. 8 is a schematic of a memory system of the computer of FIG. 7.

The storage system 712, shown in greater detail in FIG. 8, typically includes a computer readable and writeable nonvolatile recording medium 716 in which signals are stored that define a program to be executed by the processor or information to be processed by the program. The medium may include, for example, a disk or flash memory. Typically, in operation, the processor causes data to be read from the nonvolatile recording medium 716 into another memory 718 that allows for faster access to the information by the processor than does the medium 716. This memory 718 is typically a volatile, random access integrated circuit memory such as a dynamic random access memory (DRAM) or static memory (SRAM). It may be located in storage system 712, as shown, or in memory system 704. The processor 702 generally manipulates the data within the integrated circuit memory 718 and then copies the data to the medium 716 after processing is completed. A variety of mechanisms are known for managing data movement between the medium 716 and the integrated circuit memory element 718, and embodiments disclosed herein are not limited to any particular data movement mechanism. Embodiments disclosed herein are not limited to a particular memory system 704 or storage system 712.

The computer system may include specially-programmed, special-purpose hardware, for example, an application-specific integrated circuit (ASIC). Embodiments disclosed herein may be implemented in software, hardware or firmware, or any combination thereof. Further, such methods, acts, systems, system elements and components thereof may be implemented as part of the computer system described above or as an independent component.

Although computer system 700 is shown by way of example as one type of computer system upon which various embodiments disclosed herein may be practiced, it should be appreciated that the embodiments disclosed herein are not limited to being implemented on the computer system as shown in FIG. 7. Various embodiments disclosed herein may be practiced on one or more computers having a different architecture or components that that shown in FIG. 6.

Computer system 700 may be a general-purpose computer system that is programmable using a high-level computer programming language. Computer system 700 may be also implemented using specially programmed, special purpose hardware. In computer system 700, processor 702 is typically a commercially available processor such as the well-known Pentium™ or Core™ class processors available from the Intel Corporation. Many other processors are available. Such a processor usually executes an operating system which may be, for example, the Windows 7 or Windows 8 operating system available from the Microsoft Corporation, the MAC OS System X available from Apple Computer, the Solaris Operating System available from Sun Microsystems, or UNIX available from various sources. Many other operating systems may be used.

The processor and operating system together define a computer platform for which application programs in high-level programming languages are written. It should be understood that embodiments disclosed herein are not limited to a particular computer system platform, processor, operating system, or network. Also, it should be apparent to those skilled in the art that the embodiments disclosed herein are not limited to a specific programming language or computer system. Further, it should be appreciated that other appropriate programming languages and other appropriate computer systems could also be used.

One or more portions of the computer system may be distributed across one or more computer systems (not shown) coupled to a communications network. These computer systems also may be general-purpose computer systems. For example, various embodiments disclosed herein may be distributed among one or more computer systems configured to provide a service (e.g., servers) to one or more client computers, or to perform an overall task as part of a distributed system. For example, various embodiments disclosed herein may be performed on a client-server system that includes components distributed among one or more server systems that perform various functions according to various embodiments. These components may be executable, intermediate (e.g., IL) or interpreted (e.g., Java) code which communicate over a communication network (e.g., the Internet) using a communication protocol (e.g., TCP/IP). In some embodiments one or more components of the computer system 700 may communicate with one or more other components over a wireless network, including, for example, a cellular telephone network.

It should be appreciated that embodiments disclosed herein are not limited to executing on any particular system or group of systems. Also, it should be appreciated that embodiments disclosed herein are not limited to any particular distributed architecture, network, or communication protocol. Various embodiments may be programmed using an object-oriented programming language, such as Small-Talk, Java, C++, Ada, or C# (C-Sharp). Other object-oriented programming languages may also be used. Alternatively, functional, scripting, and/or logical programming languages may be used. Various embodiments disclosed herein may be implemented in a non-programmed environment (e.g., documents created in HTML, XML or other format that, when viewed in a window of a browser program, render aspects of a graphical-user interface (GUI) or perform other functions). Various embodiments disclosed herein may be implemented as programmed or non-programmed elements, or any combination thereof.

The system and methods described herein may be employed in any number of related applications. For example, a user may be provided the opportunity to selection a portion of readings, with the system then identifying similar historical readings to be displayed to the user. Such a visual query may allow a user investigating an event to locate previously-occurring events that may have been overlooked at the time they occurred. In the event that multiple previously-occurring events are identified, they may be displayed in a user interface and sorted by some criteria, such as occurrence date/time, similarity to the queried data, or a confidence level assigned by the system and/or a user. Similarly, the user may be provided the opportunity to query historic measurements by drawing a line having a shape that can be compared to the shapes of historic measurements, with potential matches being displayed to the user.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Acts of methods disclosed herein may be performed in alternate orders, and one or more of the acts may be omitted or replaced by an alternative act. The methods disclosed herein may include additional acts not explicitly described. Such alterations, modifications, and improvements are intended to be part of this disclosure, and are intended to be within the scope of the invention. Accordingly, the foregoing description and drawings are by way of example only.

What is claimed is:

1. A system for monitoring a power system comprising:
one or more component monitors in communication with components of the power system and configured to measure electrical or performance characteristics of the power system components or the power system;
a central processing unit in communication with the component monitors and configured to:
receive, from at least one of the one or more component monitors, a first set of readings for at least one of the power system components;
provide the first set of readings to be displayed in a graphical format on a user interface;
receive, from the user interface, a user selection of a portion of the first set of readings, and at least one user classification of the portion of the first set of readings;
determine at least one characteristic of the portion of the first set of readings based on the at least one user classification;
detect the at least one characteristic in a second set of readings based on a correlation between the first set of readings and the second set of readings, independent of a time period of the first set of readings and the second set of readings;
automatically apply the at least one user classification to the second set of readings in response to the at least one characteristic being detected in the second set of readings based on the correlation between the first set of readings and the second set of readings; and
a controller in communication with the central processing unit and the power system components, the controller configured to control or perform an operation on one or more aspects of the power system in response to the at least one user classification being applied to the second set of readings.

2. The system of claim 1, wherein the central processing unit is further configured to:
receive, from the user interface, a user selection of a notification profile; and
generate, responsive to detecting the at least one characteristic in the second set of readings, a notification based on the notification profile.

3. The system of claim 1, wherein the central processing unit is further configured to determine a trend in the portion of the first set of readings and to detect the trend in the second set of readings, wherein the trend in the second set of readings occurs over a different length of time than the portion of the first set of readings.

4. A method for monitoring a power system, comprising:
receiving, from at least one component monitor in communication with components of the power system, a first set of readings for at least one of the power system components at an input of a central processing unit;
providing the first set of readings to be displayed in a graphical format on a user interface;
receiving, from the user interface, a user selection of a portion of the first set of readings, and at least one user classification of the portion of the first set of readings;
determining at least one characteristic of the portion of the first set of readings based on the at least one user classification;
detecting the at least one characteristic in a second set of readings based on a correlation between the first set of readings and the second set of readings, independent of a time period of the first set of readings and the second set of readings;
automatically applying the at least one user classification to the second set of readings in response to the at least one characteristic being detected in the second set of readings based on the correlation between the first set of readings and the second set of readings; and
controlling or performing, using a controller in communication with the central processing unit and the power system components, an operation on one or more aspects of the power system in response to the at least one user classification being applied to the second set of readings.

5. The method of claim 4, further comprising the act of determining a confidence level for the application of the user classification to the second set of readings.

6. The method of claim 4, wherein determining at least one characteristic of the portion of the first set of readings comprises determining a trend in the portion of the first set of readings, and wherein detecting the at least one characteristic in the second set of readings comprises detecting the trend in the second set of readings, wherein the trend in the second set of readings occurs over a different length of time than the portion of the first set of readings.

7. The method of claim 4, wherein the act of receiving, from the user interface, at least one user classification of the portion of the first set of readings comprises receiving, from a user, a user selection of a first tag to be applied to the portion of the first set of readings.

8. The method of claim 7, further comprising providing, in the user interface, the option to select the first tag to be applied to the portion of the first set of readings.

9. The method of claim 7, wherein the first tag corresponds to an event affecting the at least one power system component.

10. The method of claim 7, wherein the act of receiving, from the user interface, at least one user classification of the portion of the first set of readings further comprises receiving, from a second user, a second user selection of a second tag to be applied to the portion of the first set of readings.

11. The method of claim 10, further comprising acts of:
determining that the first tag differs from the second tag;

ascertaining which proposed tag of the first tag and the second tag has been selected by a greater number of users to be applied to the portion of the first set of readings; and applying the proposed tag to the portion of the first set of readings.

12. The method of claim 10, further comprising acts of:

determining that the first tag differs from the second tag;

calculating tag statistics comprising a number of users that have applied the first tag to the portion of the first set of readings and a number of users that have applied the second tag to the portion of the first set of readings; and displaying the first tag, the second tag, and the tag statistics to a user of the user interface.

13. The method of claim 7, wherein the first tag indicates whether the portion of the first set of readings corresponds to a normal function of the at least one power system component.

14. The system of claim 1, wherein the power system components include at least one of a generator, a transformer, a power conditioner, an inverter, a bus, a rectifier and a transmission line.

15. The system of claim 1, wherein the electrical or performance characteristics measured by the component monitors include at least one of voltage, current, resistance, power load and impedance.

16. The system of claim 1, wherein the at least one of the one or more component monitors from which the first set of readings is received includes two component monitors working in tandem, wherein one of the two component monitors is connected to a circuit inline before the component, and the other one of the two component monitors is connected to the circuit inline after the component, wherein data from the two component monitors is combined to provide the first set of readings.

17. The system of claim 1, wherein the at least one user classification corresponds to an identified power event in the power system.

18. The system of claim 17, wherein the identified power event includes at least one of a voltage spike and events resulting from undesirable harmonic content.

19. The system of claim 1, wherein the one or more aspects of the power system that are controlled or on which the operation is performed include one or more of the power system components.

20. The system of claim 1, wherein the central processing unit is further configured to:

store the first set of readings in a memory device of the system.

* * * * *